United States Patent
Storey

(10) Patent No.: US 7,898,811 B2
(45) Date of Patent: Mar. 1, 2011

(54) THERMAL MANAGEMENT OF LEDS ON A PRINTED CIRCUIT BOARD AND ASSOCIATED METHODS

(75) Inventor: Kurt J. Storey, Winter Springs, FL (US)

(73) Assignee: Raled, Inc., Winter Springs, FL (US)

( * ) Notice: Subject to any disclaimer, the term of this patent is extended or adjusted under 35 U.S.C. 154(b) by 266 days.

(21) Appl. No.: 12/054,618

(22) Filed: Mar. 25, 2008

(65) Prior Publication Data
US 2008/0254649 A1 Oct. 16, 2008

Related U.S. Application Data

(60) Provisional application No. 60/910,918, filed on Apr. 10, 2007.

(51) Int. Cl.
*H05K 7/20* (2006.01)
(52) U.S. Cl. .................................. 361/719
(58) Field of Classification Search ............... 439/56; 361/719, 720; 362/294, 631, 373
See application file for complete search history.

(56) References Cited

U.S. PATENT DOCUMENTS

| | | | | |
|---|---|---|---|---|
| 5,113,315 A * | 5/1992 | Capp. et al. | ........... | 361/704 |
| 5,708,566 A * | 1/1998 | Hunninghaus et al. | ...... | 361/704 |
| 6,045,240 A | 4/2000 | Hochstein | ........... | 362/294 |
| 6,212,076 B1 * | 4/2001 | MacQuarrie et al. | ........ | 361/720 |
| 6,428,189 B1 | 8/2002 | Hochstein | ........... | 362/373 |
| 6,498,355 B1 | 12/2002 | Harrah et al. | ........... | 257/99 |
| 6,920,046 B2 * | 7/2005 | Spryshak | ........... | 361/704 |
| 6,966,674 B2 | 11/2005 | Tsai | ........... | 362/294 |
| 6,999,318 B2 * | 2/2006 | Newby | ........... | 361/719 |
| 7,054,159 B2 * | 5/2006 | Nakamura | ........... | 361/719 |
| 7,532,479 B2 * | 5/2009 | Ohno et al. | ........... | 361/719 |
| 7,538,424 B2 * | 5/2009 | Mullen et al. | ........... | 257/712 |
| 2004/0184272 A1 | 9/2004 | Wright et al. | ........... | 362/373 |
| 2004/0203189 A1 * | 10/2004 | Chen et al. | ........... | 438/108 |
| 2006/0023448 A1 | 2/2006 | Mok et al. | ........... | 362/231 |
| 2006/0049475 A1 | 3/2006 | Wang et al. | ........... | 257/432 |
| 2006/0098438 A1 | 5/2006 | Ouderkirk et al. | ........... | 362/294 |
| 2006/0181878 A1 | 8/2006 | Burkholder | ........... | 362/294 |
| 2006/0278885 A1 | 12/2006 | Tain et al. | ........... | 257/99 |
| 2007/0057364 A1 | 3/2007 | Wang et al. | ........... | 257/701 |
| 2007/0080360 A1 | 4/2007 | Mirsky et al. | ........... | 257/99 |
| 2007/0081340 A1 | 4/2007 | Chung et al. | ........... | 362/294 |
| 2007/0081342 A1 | 4/2007 | Szeto | ........... | 362/294 |

* cited by examiner

*Primary Examiner*—Neil Abrams
(74) *Attorney, Agent, or Firm*—Allen, Dyer, Doppelt, Milbrath & Gilchrist, P.A.

(57) ABSTRACT

A light emitting diode (LED) lighting assembly includes a printed circuit board that includes a dielectric layer sandwiched between first conductive layers. The printed circuit board includes vias extending there through, with thermally conductive plugs in the vias. A second conductive layer is on each first conductive layer and on the thermally conductive plugs. The thermally conductive plugs are enclosed by the second conductive layers. LEDs are coupled to the printed circuit board, with each LED being mounted over at least one thermally conductive plug to dissipate heat therefrom.

26 Claims, 9 Drawing Sheets

THERMAL MANAGEMENT OF LEDS ON A PRINTED CIRCUIT BOARD AND ASSOCIATED METHODS

RELATED APPLICATION

This application claims the benefit of U.S. Provisional Application 60/910,918 filed Apr. 10, 2007, the entire contents of which are incorporated herein by reference.

FIELD OF THE INVENTION

The present invention relates to the field of light emitting diodes (LEDs), and more particularly, to dissipating heat generated by LEDs mounted on a printed circuit board.

BACKGROUND OF THE INVENTION

Light emitting diodes (LEDs) are currently used as replacements for incandescent light bulbs and fluorescent lamps. LEDs are semiconductor devices that emit incoherent narrow-spectrum light when electrically biased in the forward direction of their PN junctions, and are thus referred to as solid-state lighting devices.

Solid-state lighting devices are well established in applications such as street signs, traffic and railroad signals, and indicator lamps for trucks and automobiles. High output LED fixtures suitable for general architectural lighting applications are beginning to appear on the market with system efficiencies comparable to fluorescent systems.

Performance of an LED largely depends on the ambient temperature of the operating environment. Driving an LED in high ambient temperatures may result in overheating of the LED package, eventually leading to device failure. Therefore, adequate thermal management is required to maintain a long operating life. This is especially important when considering applications where the device needs to operate over a large range of temperatures, and is required to have a low failure rate.

One approach for dissipating heat for LEDs mounted on a printed circuit board is to use a printed circuit board comprising a metal core as compared to traditional printed circuit boards comprising a dielectric core. While metal core printed circuit boards are effective for dissipating heat, disadvantages are increased costs and processing difficulties. In addition, since there are limitations to the size of metal core printed circuit boards, they are more difficult to incorporate into larger size devices.

Another approach for dissipating heat from LEDs is to attach the LEDs directly to a heat sink using a thermally conductive adhesive or tape. A disadvantage of this approach is that it is a labor-intensive process, resulting in increased costs. In addition, the resulting configuration is subject to high failure rates.

Yet another approach is disclosed in U.S. Pat. No. 6,045,240 in which LEDs are on a front side of the printed circuit board, and a heat sink is on the back side of the board. To increase the transfer of heat from the circuit board to the heat sink, the printed circuit board has a plurality of holes extending there through, and a plurality of thermally conductive pads is within the printed circuit board. The pads are of a thermally conductive plating, and each pad is associated with at least one of the holes for conducting heat from each of the leads of the LEDs to one of the pads.

A further approach is disclosed in U.S. Patent Application Publication No. 2007/0081340 in which an LED is mounted over one or more holes. The holes are lined and/or filled with a thermally conductive material to dissipate heat from the LED. The holes extend through the printed circuit board. As a result, the thermally conductive material in each hole is exposed during the manufacturing process. A disadvantage of this approach is that the exposed thermally conductive materials may have a low melting point. As a result, the exposed thermally conductive material may fall out during subsequent soldering steps involving temperatures greater than the melting point, thus rendering the filled holes useless.

Even in view of the different approaches for dissipating heat generated by LEDs mounted on a printed circuit board, there is still a need to improve thermal management thereof as well as forming the heat dissipating LED assemblies.

SUMMARY OF THE INVENTION

In view of the foregoing background, it is therefore an object of the present invention to dissipate heat from LEDs mounted on a printed circuit board without significantly increasing the cost or increasing processing associated with the printed circuit board while facilitating the ease with which the printed circuit board, LEDs and associated components are assembled.

This and other objects, features, and advantages in accordance with the present invention are provided by a method for making a light emitting diode (LED) lighting assembly comprising forming a plurality of vias through a printed circuit board, with the printed circuit board comprising a dielectric layer sandwiched between first conductive layers. The method may further comprise filling the plurality of vias with a thermally conductive material for forming a plurality of thermally conductive plugs, and forming a second conductive layer on each first conductive layer and on the plurality of thermally conductive plugs. The plurality of thermally conductive plugs may be enclosed by the second conductive layers. A plurality of LEDs may be mounted to the printed circuit board, with each LED being mounted over at least one thermally conductive plug to dissipate heat therefrom.

The second conductive layers advantageously form protective layers over the thermally conductive plugs. This advantageously protects the thermally conductive plugs during subsequent assembly steps, such as etching and soldering. Protection of the thermally conductive plugs significantly simplifies the overall assembly process, and allows the thermally conductive plugs to be formed from materials, like silver, that exhibit excellent thermal conductivity but may not be thermally stable in the conditions encountered during subsequent assembly steps.

The thermally conductive material may comprise silver. The method may further comprise forming a respective third conductive layer on sidewalls of each via before forming the plurality of thermally conductive plugs therein. The third conductive layer may comprise a material different than a material of the thermally conductive plugs. The third conductive layer may comprise copper, and each thermally conductive plug comprises silver, for example.

The method may further comprise mounting at least one heat sink to the second conductive layer opposite the plurality of LEDs. A fourth conductive layer may be formed between the at least one heat sink and the second conducting layer. The fourth conductive layer may comprise gold or silver, for example.

Each LED may comprise a heat sink coupled thereto. The method may further comprise forming a respective fifth conductive layer between each heat sink and the second conductive layer supporting the plurality of LEDs. The fifth conductive layer may comprise gold or silver, for example.

Another aspect of the present invention is directed to a light emitting diode (LED) assembly as described above. The LED assembly may comprise a printed circuit board comprising a dielectric layer sandwiched between first conductive layers, with the printed circuit board including a plurality of vias extending there through. A plurality of thermally conductive plugs may be in the plurality of vias. A second conductive layer may be on each first conductive layer and on the plurality of thermally conductive plugs, with the plurality of thermally conductive plugs being enclosed by the second conductive layers. A plurality of LEDs may be coupled to the printed circuit board, with each LED being mounted over at least one thermally conductive plug to dissipate heat therefrom.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
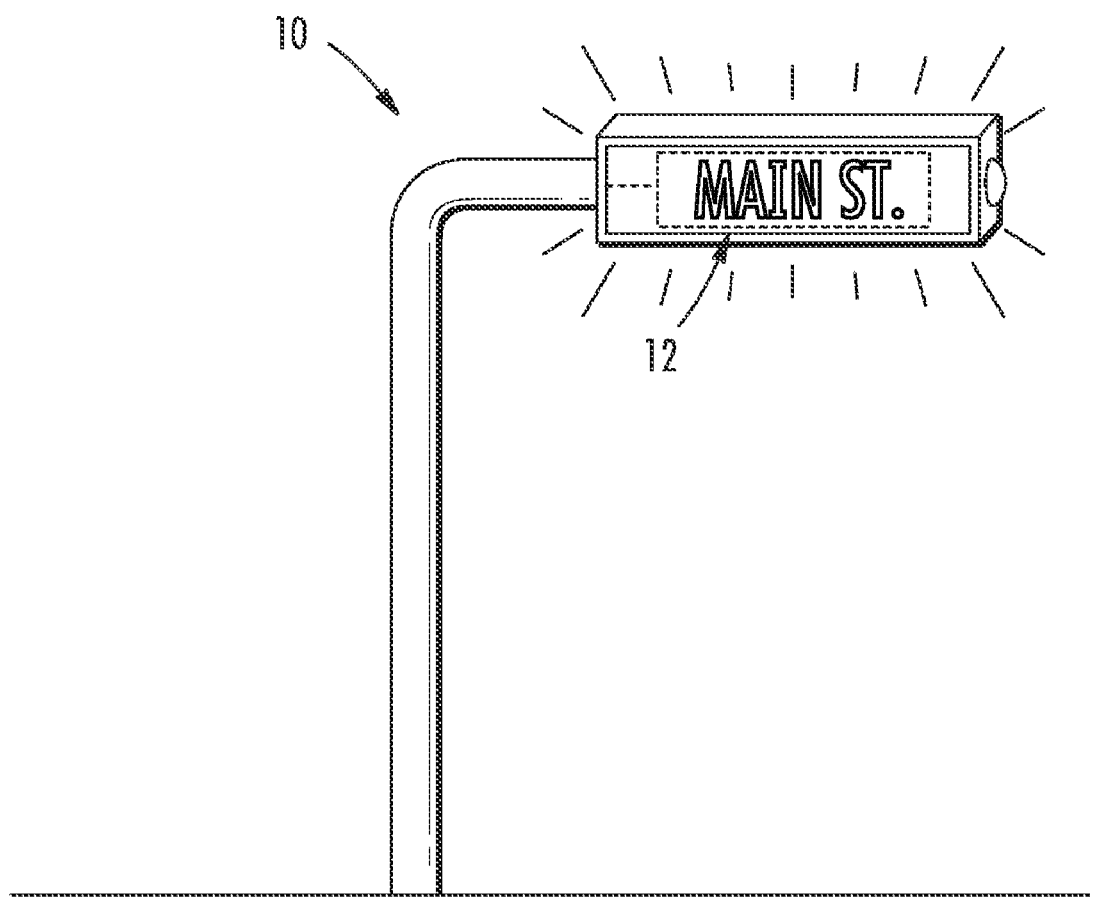
FIG. 1 is a perspective view of a street sign including an LED lighting assembly in accordance with the present invention.
Figure 2:
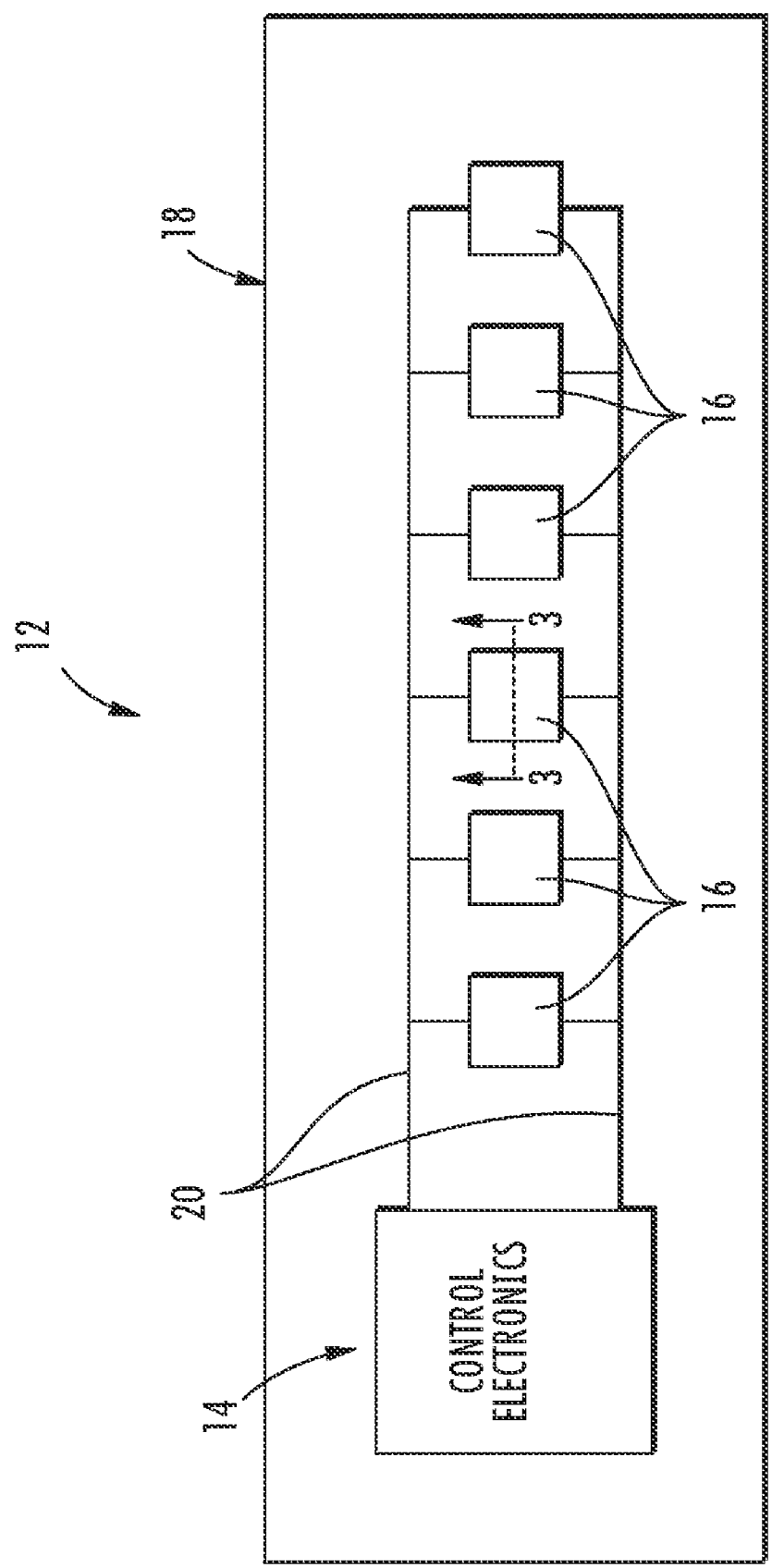
FIG. 2 is a block diagram of the LED lighting assembly of FIG. 1.

Light emitting diodes (LEDs) are currently being used as replacements for incandescent light bulbs and fluorescent lamps. In one such example, referring to FIG. 1, a street sign 10 is illuminated by a light emitting diode (LED) lighting assembly 12. Referring to FIG. 2, the LED lighting assembly 12 includes control electronics 14 and a plurality of LEDs 16 mounted on a printed circuit board 18. The printed circuit board 18 includes a plurality of traces 20 electrically connecting the LEDs 16 and the control electronics 14.

Figure 3:
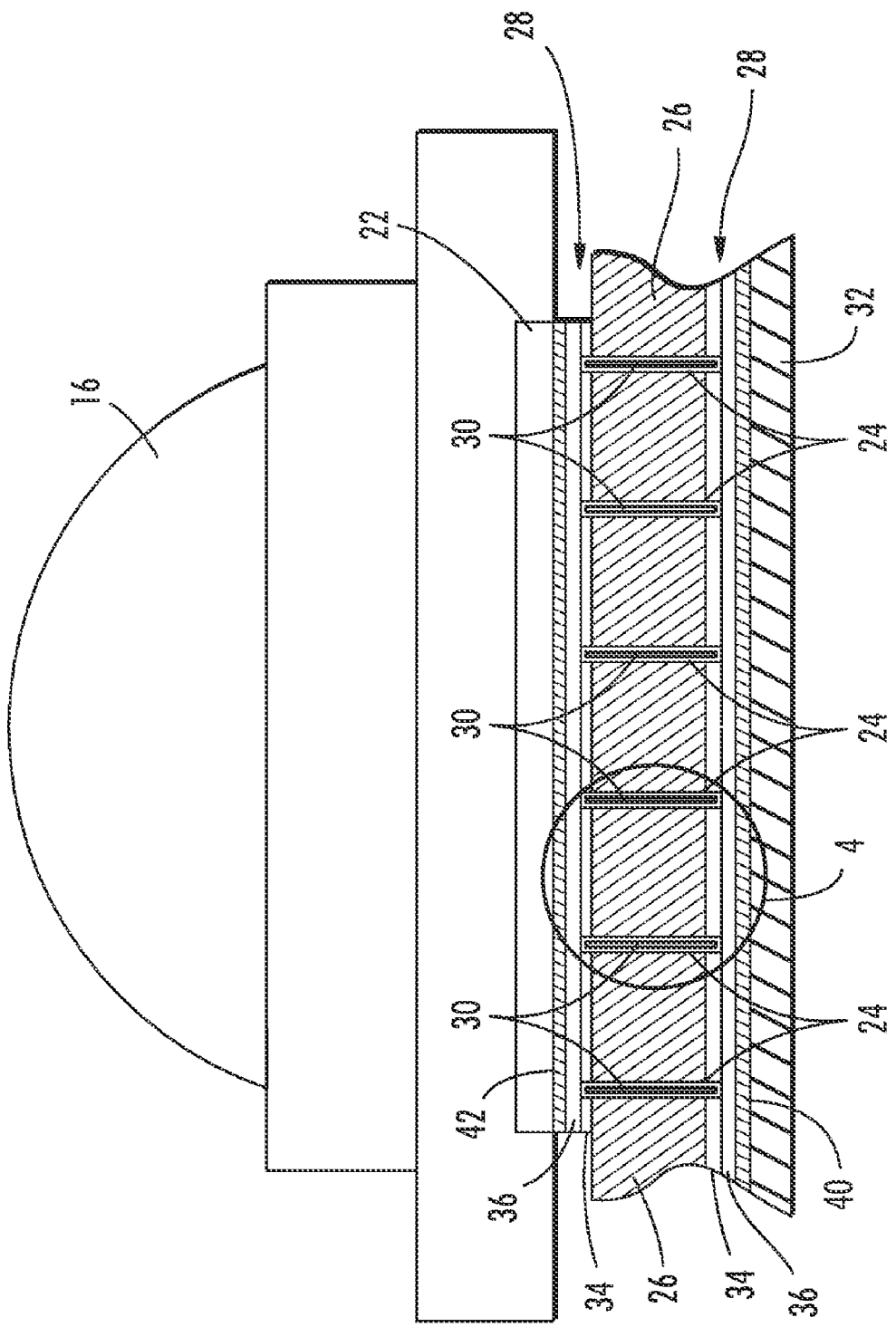
FIG. 3 is a cross-sectional side view of a portion of the LED lighting assembly taken along line 3-3 of FIG. 2.

Referring to FIG. 3, each LED 16, including an integral metal slug 22, is mounted over a plurality of vias 24 extending through the printed circuit board 18. Under each LED 16, the printed circuit board 18 includes a dielectric layer 26 sandwiched between a plurality of thermally conductive layers 28. Each via 24 extends through the dielectric layer 26 and through at least a portion of the thermally conductive layers 28. The vias 24 are filled with thermally conductive plugs 30. A heat sink 32 is mounted to the printed circuit board 18 opposite the side of the LED 16.

The dielectric layer 26 is typically a poor thermal conductor, such that heat generated by the LED 16 during operation would not be effectively dissipated through the printed circuit board 18. As described in greater detail below, the thermally conductive layers 28 and the thermally conductive plugs 30 form a thermal conduit extending across the printed circuit board 18, effectively reducing the thermal resistance of the dielectric layer 26.

Figure 4:
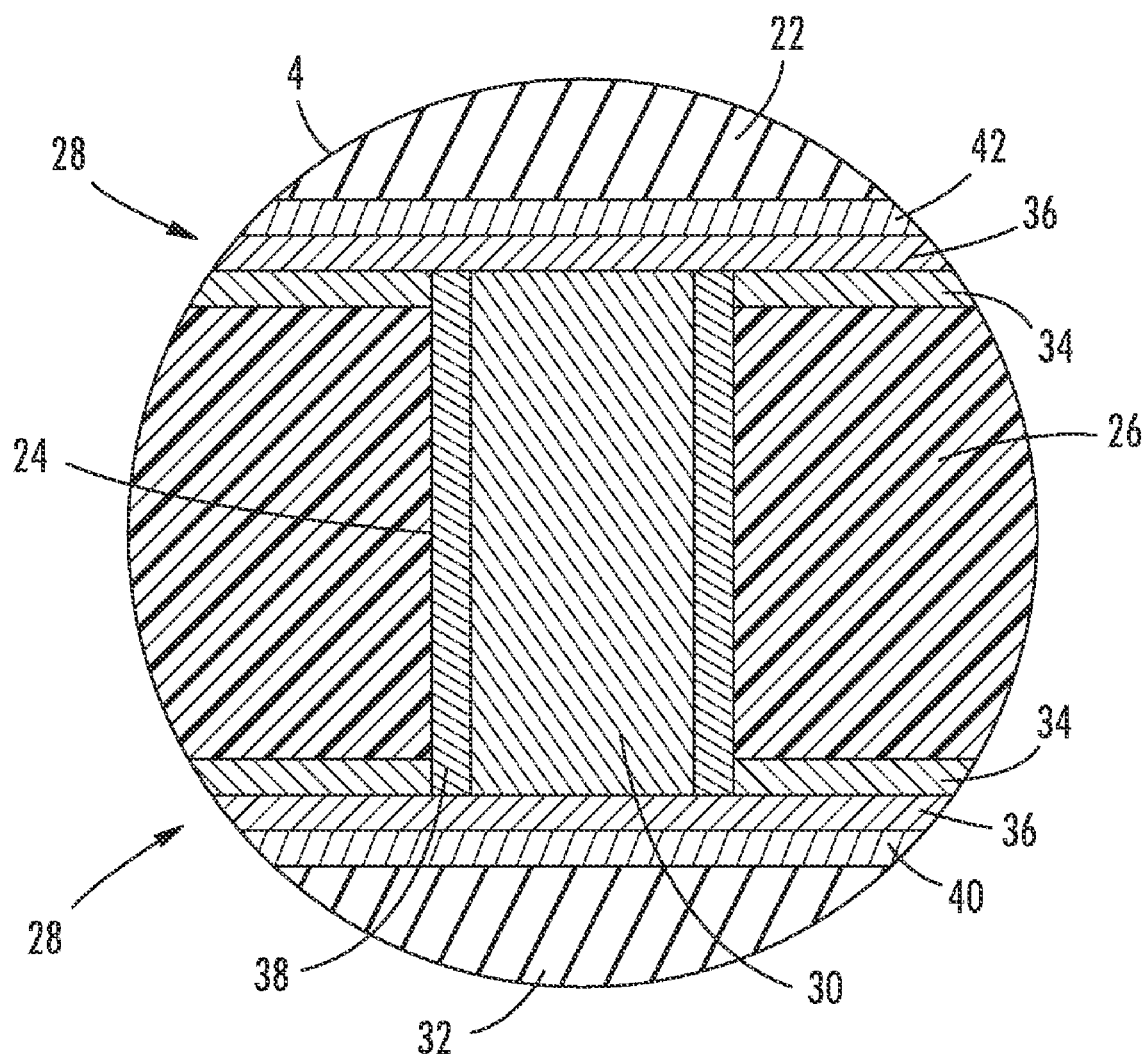
FIG. 4 is a more detailed cross-sectional side view of area 4 of FIG. 3.

Referring now FIG. 4, section 4 from the illustrated LED 16 in FIG. 3 will be discussed in greater detail. The thermally conductive layers 28 include a pair of first conductive layers 34 sandwiching the dielectric layer 26. A pair of second conductive layers 36 covers the first conductive layers 34 and encloses the thermally conductive plugs 30. A third conductive layer 38 lines the sidewalls of each via 24. Fourth and fifth conductive layers 40, 42 extend between adjacent second conductive layers 36 and, respectively, the heat sink 32 and the metal slug 22 from the LED 16.

As will be appreciated from the foregoing description, heat generated by each LED 16 is conducted away from the LED by the adjacent fifth conductive layer 42, second conductive layer 36 and first conductive layer 34. The heat is then transferred through the dielectric layer 26 by the thermally conductive plugs 30 and second conductive layers 38 in the vias 24, and into the heat sink 32 through the opposite first, second and fourth conductive layers 34, 36 and 40.

Figure 5:
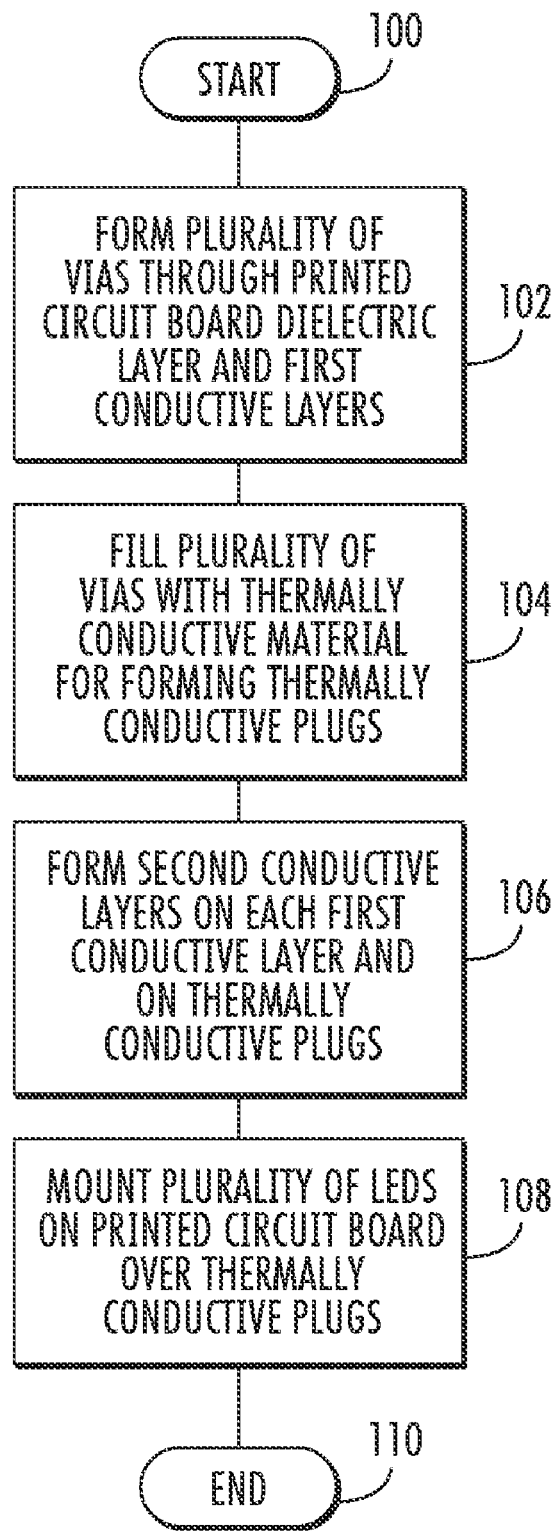
FIG. 5 is a flow diagram of a method for making a LED lighting assembly in accordance with the present invention.

Referring to FIG. 5, another aspect is directed to a method for making the LED lighting assembly 12 as described above. From the start (Block 100), the vias 24 are formed through the dielectric layer 26 and the first conductive layers 34 of the printed circuit board 18. The vias 24 are filled with a thermally conductive material, such as silver, to form the thermally conductive plugs 30 at Block 104. The sidewalls of the vias 24 may be lined with a third conductive layer 38 before forming the thermally conductive plugs 30. The third conductive layer 38 may be formed from the same material as the thermally conductive plugs 30 or a different material, such as copper.

At Block 106, the second conductive layers 36 are formed on each first conductive layer 34 and enclose the thermally conductive plugs 30, as well as the third conductive layers 38. Although not illustrated in the flow diagram, fourth and fifth conductive layers 40, 42 may be formed over the respective second conductive layers 36. The fourth and fifth conductive layers 40, 42 may comprise gold or silver, for example. At Block 108, the LEDs 16 are each mounted on the printed circuit board 18 over the vias 24 filled with the thermally conductive plugs 30. The method ends at Block 110.

Figure 6:
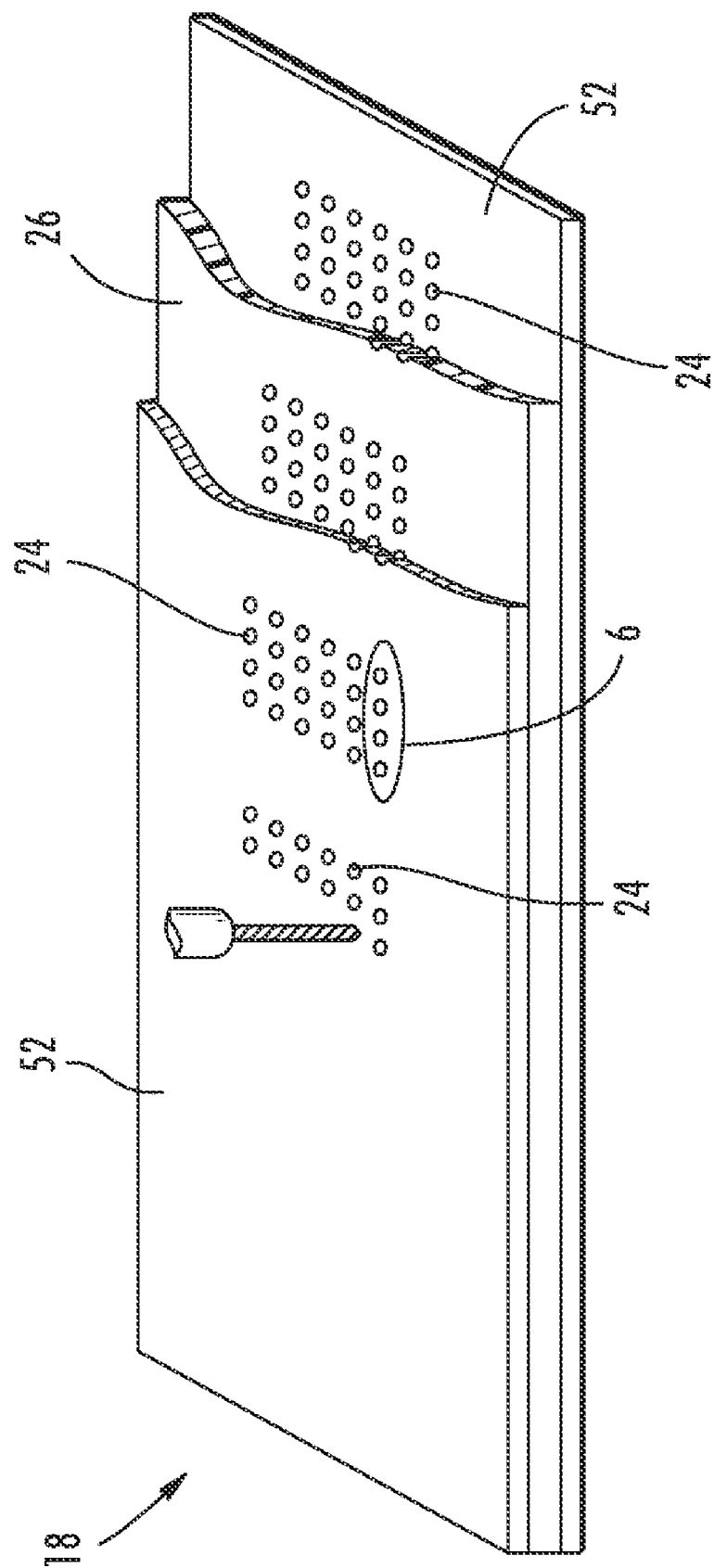
FIG. 6 is a perspective view of the printed circuit board of FIG. 2 in a partially assembled state, with components partially cut away to show details.
Figure 7:
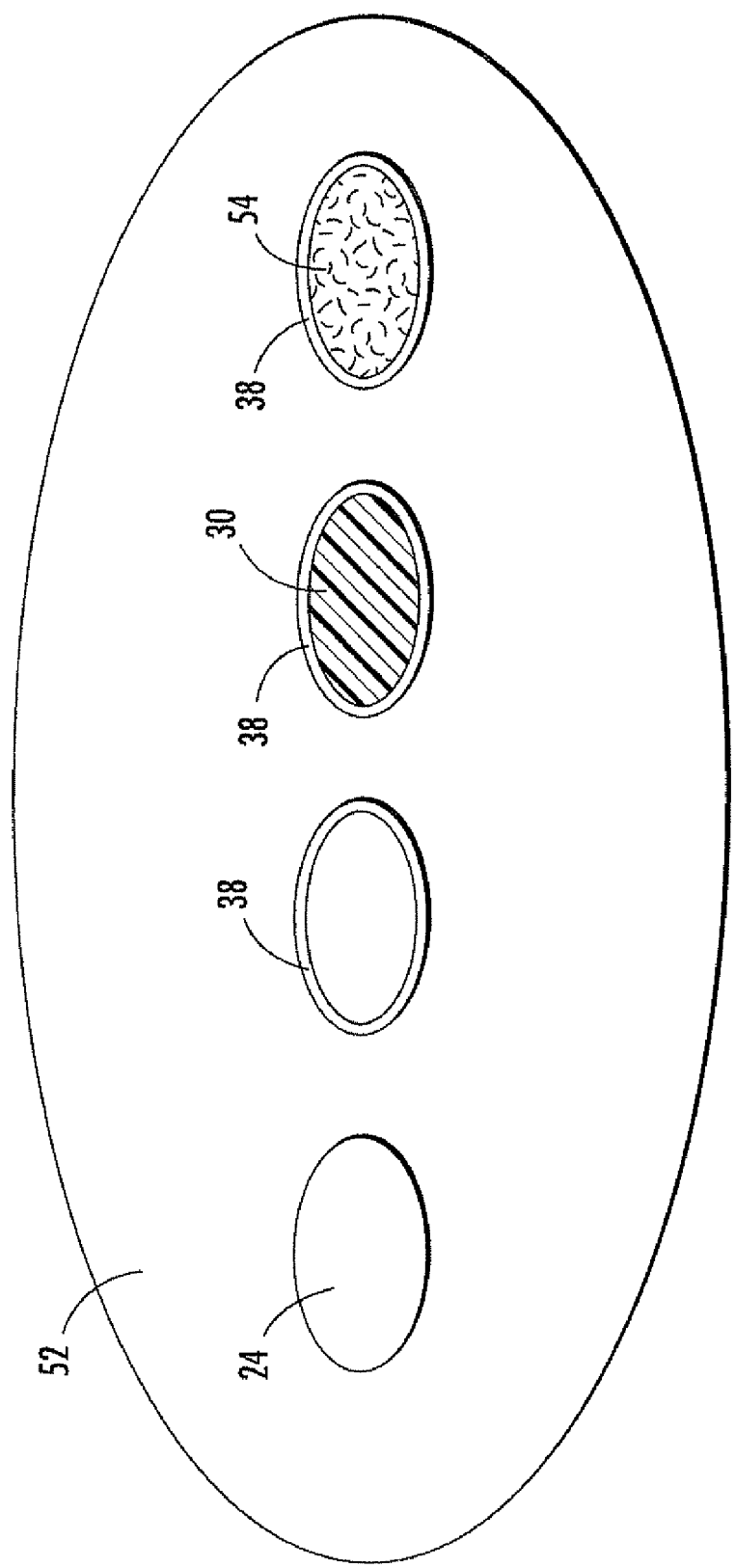
FIG. 7 is a detailed perspective view of area 6 of FIG. 6, showing a thermally conductive plug in various states of formation.
Figure 8:
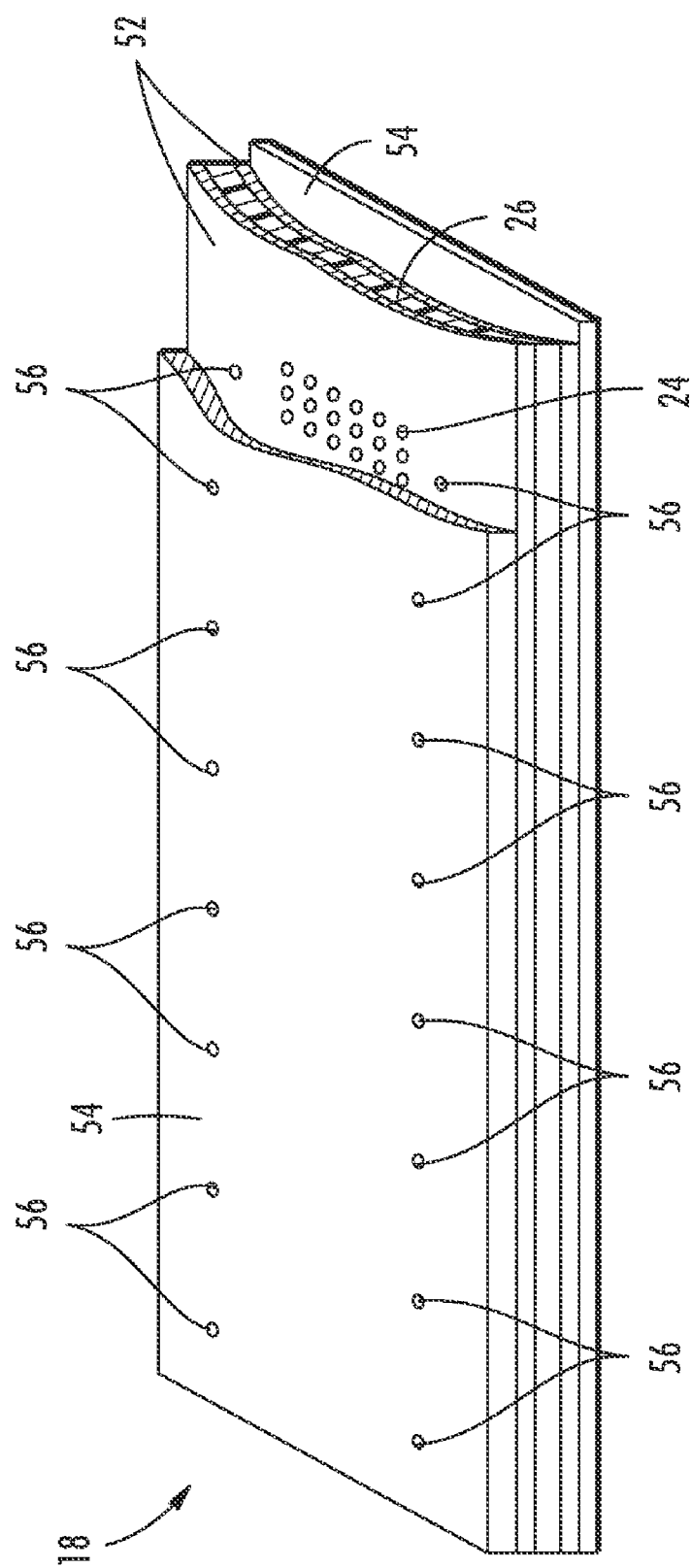
FIG. 8 is a perspective view of the printed circuit board of FIG. 2, in a more advanced state of assembly than FIG. 5, with components partially cut away to show details.
Figure 9:
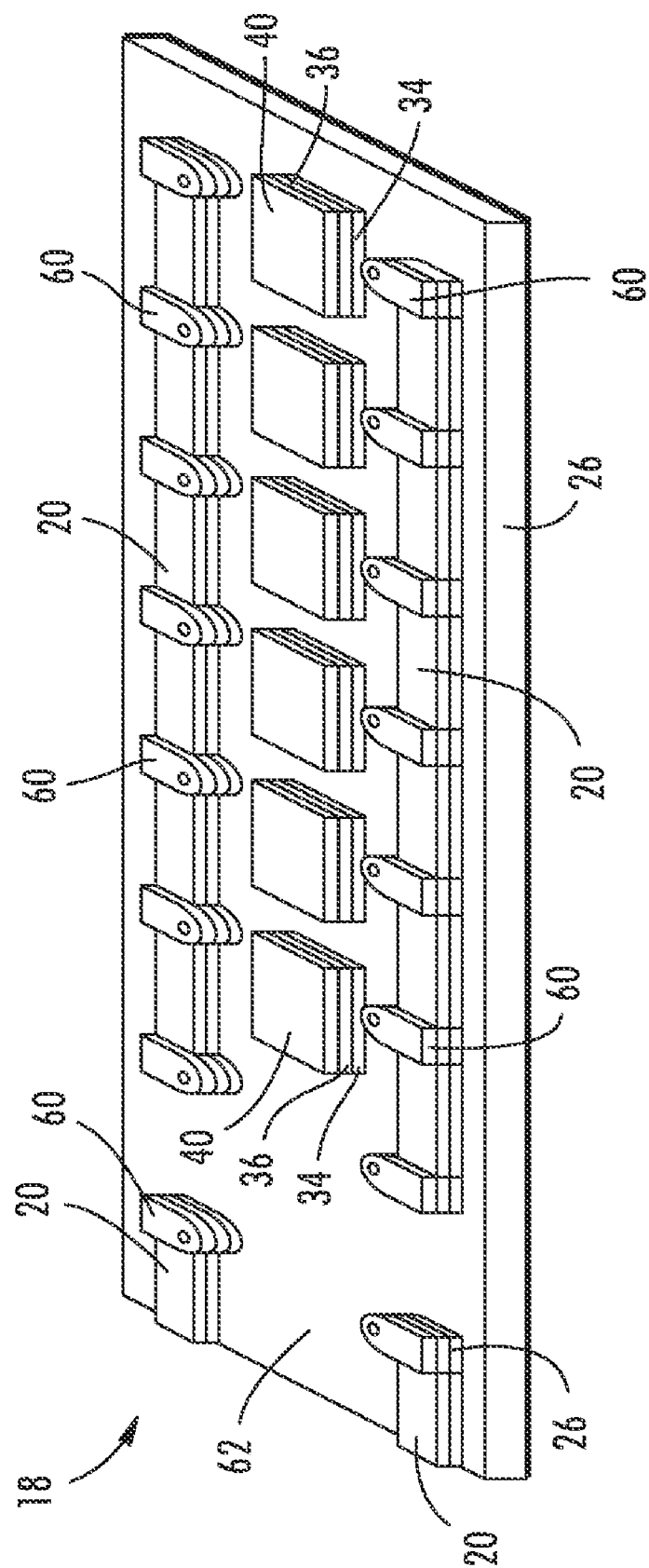
FIG. 9 is a perspective view of the printed circuit board of FIG. 2, prior to mounting the control electronics and LEDs thereon.

Referring to FIGS. 6-9, one manner of realizing the method for making the LED lighting assembly 12 is illustrated. In FIG. 6, the plurality of vias 24 is formed in the printed circuit board 18. The printed circuit board 18 includes the dielectric layer 26 sandwiched between resident copper cladding layers 52, portions of which form the first conductive layers 34. The plurality of vias 24 extends through the cladding layers 52 and the dielectric layer 26.

The third conductive layers 38 are formed by plating copper onto the sidewalls of the vias 24. A silver paste 54 is flowed into the vias 24, and then reflowed to form solid silver thermally conductive plugs 30. Advantageously, the copper conductive layers 38 improve adherence of the thermally conductive plugs 30 within the vias 24.

Additional copper conductive layers 54 are then plated over both sides of the circuit board 50, substantially covering the cladding layers 52 and enclosing the plugs 30 within the vias 24. Portions of the additional layers 54 will form the second conductive layers 36, protecting the plugs 30 during subsequent assembly steps, retaining the plugs 30 within the vias 24 under conditions that would potentially render all or a portion of the plugs 30 thermally, chemically or mechanically unstable. The subsequent assembly steps can then be performed more quickly and easily, without concern that the plugs 30 will fall out of the vias 24.

Additional vias 56 are then drilled through the printed circuit board 18 as connection points for circuit board components, such as the control electronics 14 and electrical connections for the LEDs 16. These additional vias 56 extend through the dielectric layer 26, the cladding layers 52 and the additional layers 54.

The cladding layers 52 and the additional layers 54 are selectively removed by etching to form the traces 20. The etching also separates the first and second conductive layers 34, 36 from each other and from the traces 20.

The preceding steps are formed in a controlled environment to prevent oxidation of exposed copper surfaces that would render the copper surfaces unsuitable for subsequent soldered connections. To allow subsequent steps to be conducted in a less controlled environment, protective layers are formed over both sides of the circuit board subassembly 50.

At component connection points surrounding the additional vias 56, electrical conductors 60, such as solder, gold or silver, are plated onto the traces. Over the protective layers 36, gold or silver is also plated to form the fourth and fifth conductive layers 40, 42. Over remaining areas of the printed circuit board 18 and traces 20 a solder mask 62 is applied. The solder mask 62 is typically a transparent polymer coating that provides protection from the environment, and prevents shorting between traces during subsequent assembly steps.

To complete the LED lighting assembly 12, the control electronics 14 and the LEDs 16 are mounted to the printed circuit board 18, typically by soldering. This results in the LED lighting assembly of FIG. 2.

It will be appreciated that the method for making the LED lighting assembly 12 allows a thermal conduit to be formed quickly and easily formed through the printed circuit board 18, and also facilitates subsequent assembly steps by protectively securing the plugs 30 within the vias 24. Such LED lighting assemblies 12 can be made more quickly and with higher yield rates.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included as readily appreciated by those skilled in the art.

That which is claimed:

1. A method for making a light emitting diode (LED) lighting assembly comprising:
   forming a printed circuit board comprising the steps of
      forming a plurality of vias through a dielectric layer sandwiched between first conductive layers, with the dielectric layer having opposing sides completely covered by the first conductive layers,
      filling the plurality of vias with a thermally conductive material for forming a plurality of thermally conductive plugs,
      forming a second conductive layer on each first conductive layer and on the plurality of thermally conductive plugs for protecting the plurality of thermally conductive plugs during subsequent assembly steps, with the second conductive layers completely covering exposed outer surfaces of the plurality of thermally conductive plugs and exposed outer surfaces of the first conductive layers; and
   mounting a plurality of LEDs to the printed circuit board, with each LED being mounted over at least one thermally conductive plug to dissipate heat therefrom.

2. The method according to claim 1, wherein the thermally conductive material comprises silver.

3. The method according to claim 1, wherein forming the printed circuit board further comprises forming a respective third conductive layer on sidewalls of each via before forming the plurality of thermally conductive plugs therein.

4. The method according to claim 3, wherein the third conductive layer comprises a material different than a material of the thermally conductive plugs.

5. The method according to claim 3, wherein the third conductive layer comprises copper, and each thermally conductive plug comprises silver.

6. The method according to claim 1, further comprising mounting at least one heat sink to the second conductive layer opposite the plurality of LEDs.

7. The method according to claim 6, further comprising forming a fourth conductive layer between the at least one heat sink and the second conducting layer.

8. The method according to claim 7, wherein the fourth conductive layer comprises at least one of gold and silver.

9. The method according to claim 1, wherein each LED comprises a heat sink coupled thereto; and further comprising forming a respective fifth conductive layer between each heat sink and the second conductive layer supporting the plurality of LEDs.

10. The method according to claim 9, wherein the fifth conductive layer comprises at least one of gold and silver.

11. The method according to claim 1, further comprising mounting a controller to the printed circuit board, with the controller being coupled to the plurality of LEDs.

12. A light emitting diode (LED) lighting assembly comprising:
   a printed circuit board comprising
      a dielectric layer sandwiched between first conductive layers, with a plurality of vias extending therethrough, with said dielectric layer having opposing sides completely covered by said first conductive layers,
      a plurality of thermally conductive plugs in the plurality of vias,
      a second conductive layer on each first conductive layer and on said plurality of thermally conductive plugs, with said second conductive layers completely covering exposed outer surfaces of said plurality of thermally conductive plugs and exposed outer surfaces of said first conductive layers; and
   a plurality of LEDs coupled to said printed circuit board, with each LED being mounted over at least one thermally conductive plug to dissipate heat therefrom.

13. The LED lighting assembly according to claim 12, wherein said thermally conductive material comprises silver.

14. The LED lighting assembly according to claim 12, wherein said printed circuit board further comprises a third conductive layer on sidewalls of each via, with each thermally conductive plug being in contact with a respective third conductive layer.

15. The LED lighting assembly according to claim 14, wherein said third conductive layer comprises a material different than a material of said thermally conductive plugs.

16. The LED lighting assembly according to claim 15, wherein said third conductive layer comprises copper, and each thermally conductive plug comprises silver.

17. The LED lighting assembly according to claim 12, further comprising at least one heat sink coupled to said second conductive layer opposite said plurality of LEDs.

18. The LED lighting assembly according to claim 17, further comprising forming a fourth conductive layer between said at least one heat sink and said second conducting layer.

19. The LED lighting assembly according to claim 18, wherein said fourth conductive layer comprises at least one of gold and silver.

20. The LED lighting assembly according to claim 12, wherein each LED comprises a heat sink coupled thereto; and further comprising a respective fifth conductive layer between each heat sink and said second conductive layer supporting said plurality of LEDs.

21. The LED lighting assembly according to claim 20, wherein said fifth conductive layer comprises at least one of gold and silver.

22. The LED lighting assembly according to claim 12, further comprising a controller on said printed circuit board and coupled to said plurality of LEDs.

23. A light emitting diode (LED) lighting assembly comprising:

a printed circuit board comprising
        a dielectric layer sandwiched between first conductive layers, with a plurality of vias extending therethrough, with said dielectric layer having opposing sides completely covered by said first conductive layers,
        a second conductive layer on sidewalls of each via, said second conductive layer comprising copper,
        a plurality of thermally conductive plugs in the plurality of vias and in contact with a respective second conductive layer, said thermally conductive plugs comprising silver,
        a third conductive layer on each first conductive layer and on said plurality of thermally conductive plugs, with said third conductive layers completely covering exposed outer surfaces of said plurality of thermally conductive plugs and exposed outer surfaces of said first conductive layers; and
    a plurality of LEDs coupled to said printed circuit board, with each LED being mounted over at least one thermally conductive plug to dissipate heat therefrom; and
    at least one heat sink coupled to said third conductive layer opposite said plurality of LEDs.

24. The LED lighting assembly according to claim 23, further comprising a fourth conductive layer between said at least one heat sink and said second conducting layer.

25. The LED lighting assembly according to claim 23, wherein each LED comprises a heat sink coupled thereto; and further comprising a respective fifth conductive layer between each heat sink and said second conductive layer supporting said plurality of LEDs.

26. The LED lighting assembly according to claim 23, further comprising a controller on said printed circuit board and coupled to said plurality of LEDs.

\* \* \* \* \*